United States Patent [19]
Sakata

[11] Patent Number: 5,207,578
[45] Date of Patent: May 4, 1993

[54] HEAT PROCESSING APPARATUS OF VERTICAL TYPE

[75] Inventor: Kazunari Sakata, Tokyo, Japan

[73] Assignee: Toyko Electron Sagami Limited, Kanawaga, Japan

[21] Appl. No.: 831,940

[22] Filed: Feb. 6, 1992

[30] Foreign Application Priority Data

Feb. 26, 1991 [JP] Japan .................................. 3-103693

[51] Int. Cl.⁵ .............................................. F27D 3/12
[52] U.S. Cl. ..................................... 432/241; 432/253; 432/152; 432/153
[58] Field of Search ............... 432/241, 205, 206, 152, 432/253, 5, 6

[56] References Cited

U.S. PATENT DOCUMENTS

| | | | |
|---|---|---|---|
| 4,610,628 | 9/1986 | Mizushina | 432/241 |
| 4,938,691 | 7/1990 | Ohkase et al. | 432/253 |
| 4,976,613 | 12/1990 | Watanabe | 432/241 |
| 4,981,436 | 1/1991 | Watanabe | 432/241 |

FOREIGN PATENT DOCUMENTS 62-36817  2/1987  Japan .

Primary Examiner—Henry C. Yuen
Attorney, Agent, or Firm—Oblon, Spivak, McClelland, Maier & Neustadt

[57] ABSTRACT

A heat processing apparatus of the vertical type includes a box which has a process tube in the upper half thereof and a space in the lower half thereof. A cap for the process tube can be moved up and down between an upper position where the cap closes the process tube while holding a wafer boat on it and a lower position in the space where it opens the process tube. Clean air is supplied into the space through a dust removing filter located on one side of the space and exhausted from the space through the other side of the space. The air thus exhausted is collected by a gas processing system, which serves to remove harmful components from the air thus collected. A scavenger is arranged enclosing the open bottom of the process tube. Gas remaining in the process tube after the heat process is sucked by the scavenger and collected by another gas processing system.

19 Claims, 5 Drawing Sheets

HEAT PROCESSING APPARATUS OF VERTICAL TYPE

BACKGROUND OF THE INVENTION

1. Field of the Invention

The present invention relates to a heat processing apparatus of the vertical type.

2. Description of the Related Art

The heat processing apparatus of the vertical type is usually used to carry out heat diffusing and film forming processes in the course of manufacturing semiconductor devices. This is because the heat processing apparatus of this type can keep the process tube free from dusts and also save the space which the apparatus occupies.

In the case of this heat processing apparatus, the heat processing furnace comprises a process tube shaped like a cylinder and made of quartz, and heaters and heat insulating material enclosing the process tube. The heat processing furnace thus arranged is erected and located in the upper half of a rectangular box. Formed in the lower half of the box is a space in which a wafer boat having on it a plurality of objects such as semiconductor wafers to be processed is held. The wafer boat thus held in the space is loaded and unloaded in and out of the heat processing furnace by a lifter means such as the boat elevator. The apparatus further includes a system for exhausting process gas and hot gas discharged from the heat processing furnace.

According to the heat processing apparatus of the vertical type arranged as described above, the space it occupies can be more saved and the total space for the semiconductor devices manufacturing system can be thus reduced to a greater extent, as compared with the heat processing apparatus of the horizontal type in which the heat processing furnace is set horizontal. In addition, the semiconductor wafers housed in the wafer boat can be made free from dusts because the wafer boat can be loaded and unloaded into and out of the heat processing furnace while being kept not contacted with the process tube.

In order to further keep the wafers not contaminated by dusts, there is also used another heat processing apparatus of the vertical type wherein a clean gas or air is allowed to flow through the space after passing through a dust removing filter, so as to prevent dusts from adhering to the wafers held in the space. The air which has passed through the space is discharged in this case into a maintenance room prepared, different from the clean room, to repair the heat processing apparatus.

In any case of these conventional heat processing apparatuses of the vertical type wherein the air once taken into the heat processing apparatus is discharged into the maintenance room, however, there cannot be avoided the possibility that particles discharged from the heat processing furnace may adhere to the semiconductor wafers. The semiconductor devices have been made smaller and smaller in size. In addition, the need of making them more highly integrated and producing them in a larger scale of mass production has become stronger and stronger these days. The adhering of dusts to the wafers, therefore, can add great influence to these tendencies because it can reduce the productivity of semiconductor devices. When attention is paid to the fact that the minimum width dimension of the semiconductor pattern is changing from 1.0 $\mu$m to 0.5 $\mu$m, it is strongly desired that the above-mentioned drawbacks will be eliminated.

Further, various harmful gases such as phosphine ($PH_3$) and arsenic (As) are used as process gas at the time of heat process. Conventionally, these gases could be sufficiently exhausted by the exhaust system located at the open bottom of the heat processing furnace, because the amount of these gases used was relatively small and thus the amount of harmful gases remaining in the apparatus was extremely small. Therefore, no problem was caused even if the clean air which had passed through the space was discharged into the maintenance room.

As the semiconductor wafers become larger and larger in size, changing their size from 5 and 6 inches to 8 inches, however, the amount of gases used has become quite larger. This makes it impossible that sufficient exhaust is achieved only by the above-mentioned exhaust system. The influence of the harmful gases which will be added to the operator cannot be neglected, accordingly.

Further, the introducing of impurities into the semiconductor wafers or the doping of impurities such as P and As into them was also carried out by ion implantation systems. When the total cost and the manufacturing efficiency are taken into consideration, and when the difficulty of minimizing the semiconductor pattern in the order of microns because of heat diffusion caused by the annealing of the wafers after ion implantation is also taken into consideration, however, it has become these days that the impurity doping is carried out while conducting the film forming process. This is because the heat processing apparatus of the vertical type has been quite remarkably improved.

In the recent phosphor doping, quite high corrosive phosphorous oxychloride ($POCl_3$) is used as process gas and it is introduced into the furnace by carrier gas such as oxygen or nitrogen gas. The heat process is carried out at a temperature of about 900° C. in this case. When the heat process is finished, inactive gas is introduced into the furnace and gases remaining in the furnace are thus purged from the furnace. This purging of remaining gases is repeated several times. The wafer boat is then unloaded out of the furnace and held in the apparatus until the processed semiconductor wafers in it are cooled to about 200° C.

Although $POCl_3$ in the atmosphere in the furnace has been almost purged from the furnace in this case, $POCl_3$ and others not reacted are still released from the surface of each of the processed semiconductor wafers. This $POCl_3$ reacts with water or oxygen in the atmosphere to generate a reacted product in which phosphorous pentoxide is mainly contained. This reacted product containing mainly phosphorous pentoxide therein is liquid or solid depending upon its state generated. Particularly when it is liquid, its corrosiveness is quite so high as to easily corrode stainless steel. Various metal parts in the apparatus and means related to the apparatus can be thus eroded. When the reacted product containing mainly phosphorous pentoxide is left in the apparatus, therefore, micro-particles of corrosion float in the apparatus to adhere to the semiconductor devices, thereby lowering the productivity of the devices.

SUMMARY OF THE INVENTION

The present invention is therefore intended to eliminate the above-mentioned drawbacks.

Accordingly, an object of the present invention is to keep the cleanliness of atmosphere in the space in the lower half of the heat processing apparatus and also to keep that of atmosphere in the clean room without lowering the cleanliness of atmosphere in the maintenance room.

Another object of the present invention is to prevent particles from being generated by corrosion in the maintenance and clean rooms, to thereby enhance the productivity of objects to be processed.

A further object of the present invention is to prevent the safety from being lowered by harmful gases remaining in the heat processing furnace after they are used in the furnace.

According to an aspect of the present invention, there is provided a heat processing apparatus of the vertical type comprising an apparatus box having at the lower end portion thereof an opening through which an object to be processed are carried in and out of the box; a door for opening and hermetically closing the opening of the box; a process tube having an open bottom and located in the upper half of the box; heaters enclosing the process tube; a space formed in the lower half of the box and under the process tube, and connected to the opening of the box; a cap for closing the open bottom of the process tube and supporting the object at the time of heat process; an elevator arranged in the box and serving to move the cap up and down between a position where the open bottom of the process tube is closed and another position in the space where the open bottom is opened; drive mean for driving the elevator; supply means for supplying a clean gas into the space provided with a first port by which the supply means is connected to the space; exhausting means for exhausting outside the box the clean gas which has passed through the space, and provided with a second port communicated with the space, said second port being located on that side of the cap which is opposed to the first port of the supply means; and collecting means for drawing and collecting the gas introduced by the exhausting means.

According to a heat processing apparatus of the vertical type of the present invention, the clean gas (or air) is introduced into the space by the supply means and it is made to flow sideward in the space so as to prevent particles from adhering to the object such as a wafer boat housing semiconductor wafers to be processed. The clean gas which has passed through the space is collected in a place and exhausted outside the apparatus box by the exhaust means. It is then exhausted into the collecting means, such as a gas processing system common to a factory, through ducts.

The clean gas which has passed through the space is discharged, as described above, into the gas processing system. Any gas which may contain particles and harmful components is not therefore discharged into the maintenance room. The productivity of semiconductor wafers can be thus made higher and the influence of harmful components which will be added to human body can also be prevented. In addition, high corrosive gases can be prevented from staying in the apparatus. This prevents the corrosion of metal parts in the apparatus and means related to the apparatus, which is also a cause for lowering the productivity of semiconductor wafers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The heat processing apparatus of the vertical type according to an embodiment of the present invention will be described in detail with reference to the accompanying drawings.

Figure 1:
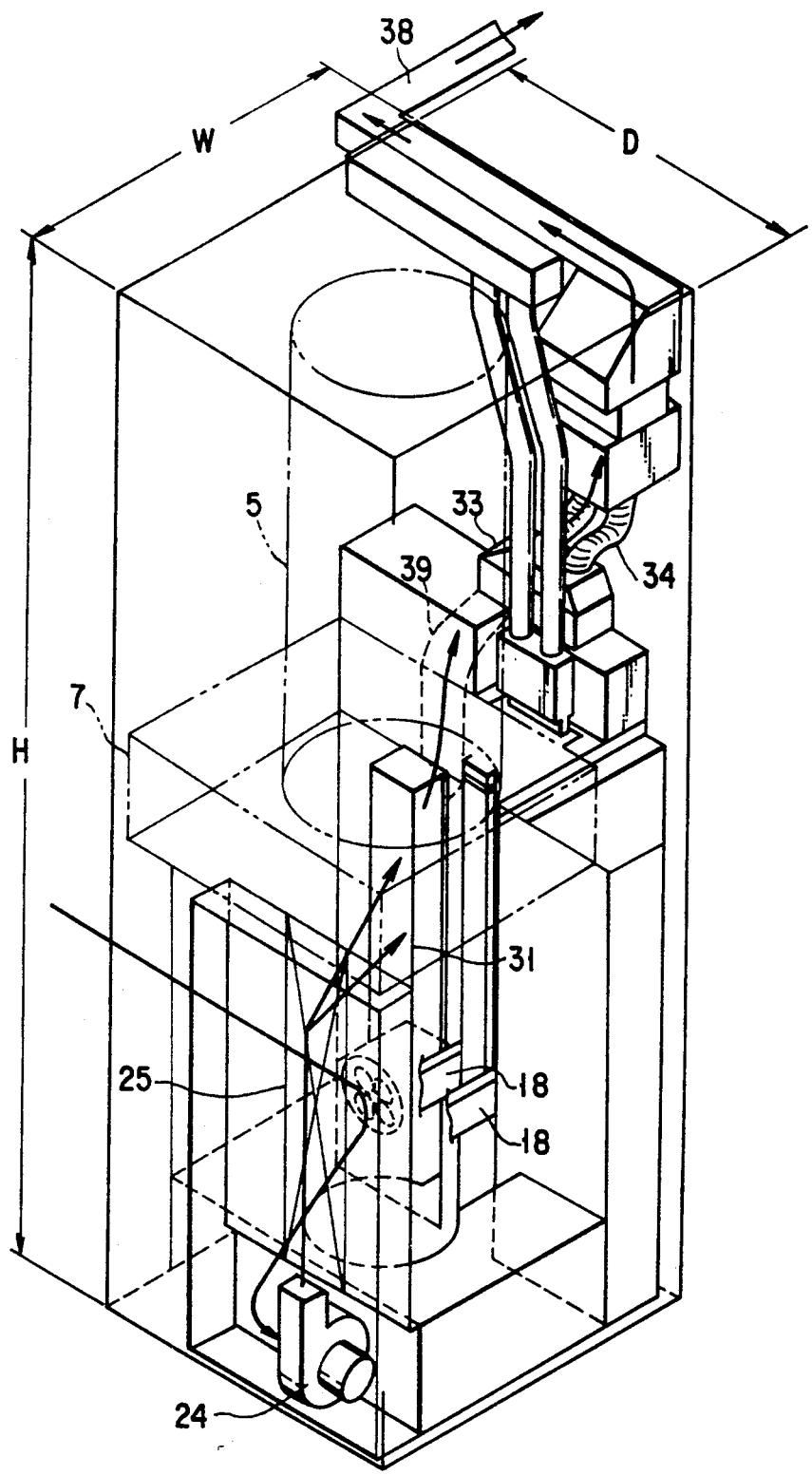
FIG. 1 is a view showing the heat processing apparatus according to an embodiment of the present invention.
Figure 2:
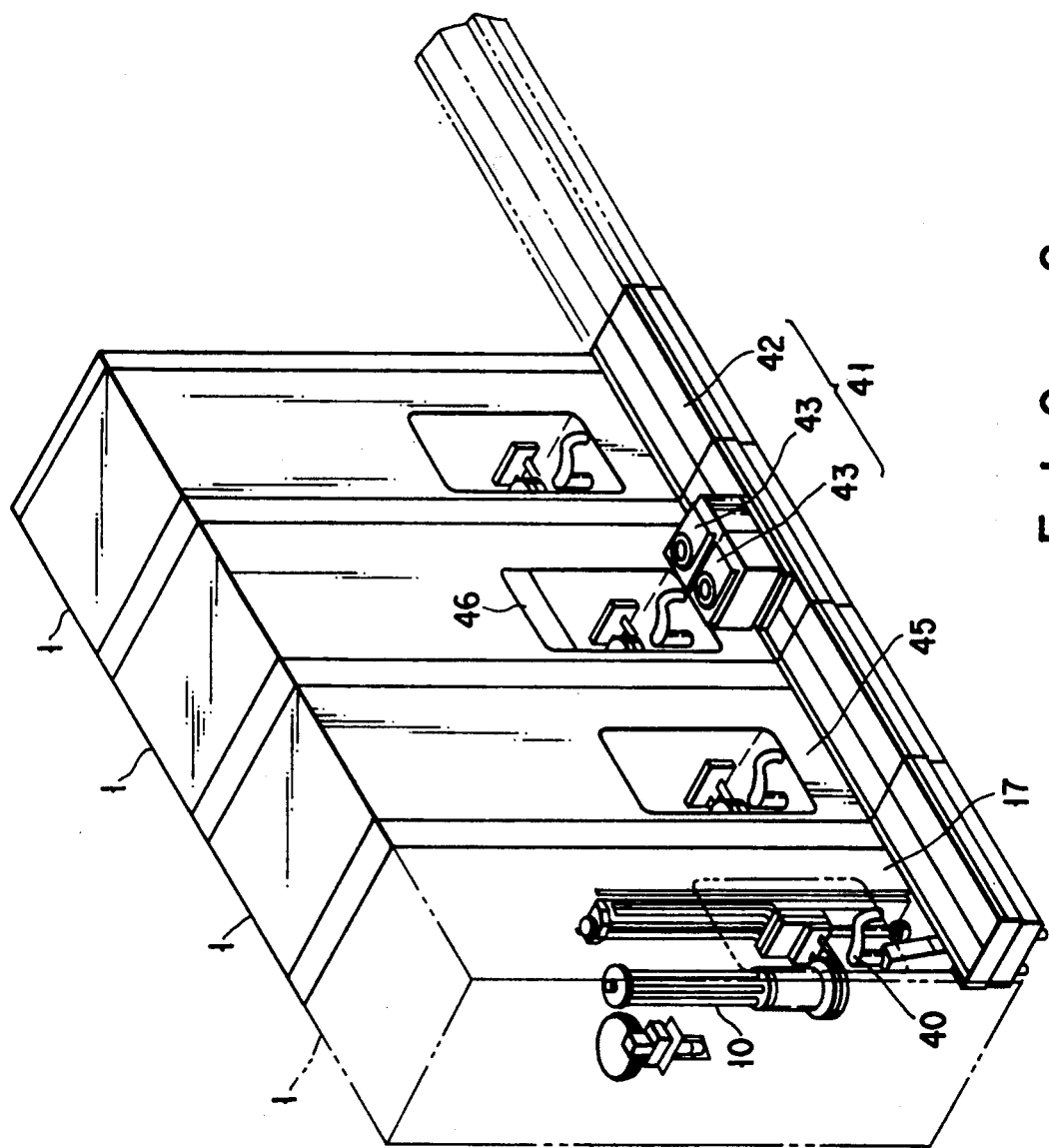
FIG. 2 is a view showing how the heat processing apparatuses, one of which is shown in FIG. 1, are positioned.
Figure 3:
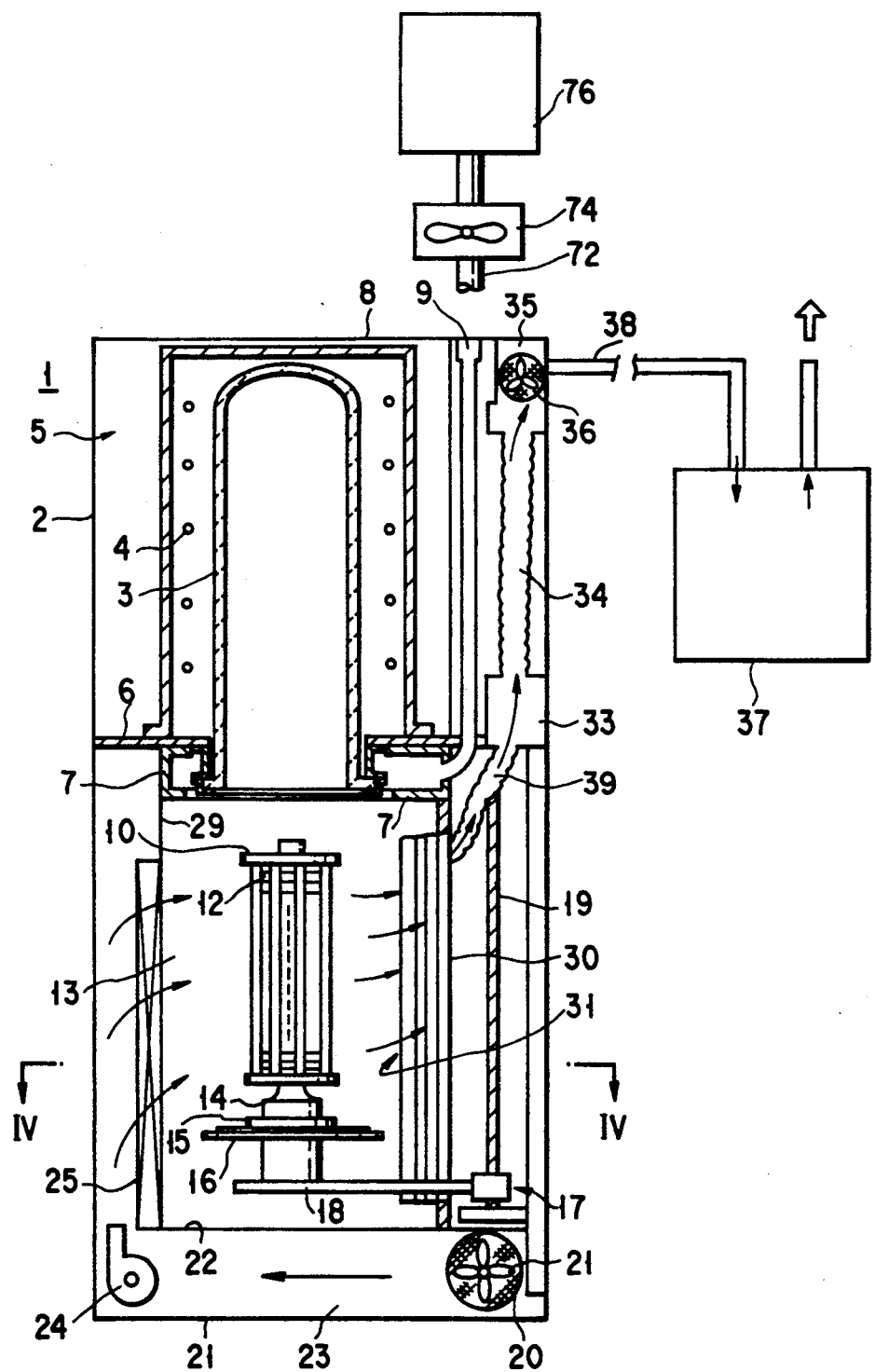
FIG. 3 is a vertically-sectioned view showing the heat processing apparatus of the vertical type in FIG. 1.

As shown in FIGS. 1, 2 and 3, the heat processing apparatus 1 of the vertical type has a rectangular box 2 made of stainless steel, for example, and having a width W of about 950 mm, a depth D of about 900 mm and a height H of about 2800 mm.

A cylindrical process tube 3 made of quartz is housed in the upper half of the box 2. Heaters 4 and heat processing furnace 5 made of heat insulating material are erected, enclosing the process tube 3 in the box 2. The lower end of the heat processing furnace 5 is supported by a base plate 6 made of stainless steel in the center portion of the box 2.

A box-shaped scavenger 7 made of stainless steel, for example, is located under the base plate 6 to exhaust process and hot gases remaining in the heat processing furnace 5. A heat exhausting duct 9 is connected to one side of the scavenger 7. A through-hole through which the process tube 3 is inserted into the heat processing furnace is formed in the center portions of the scavenger 7 and the base plate 6.

Figure 6:
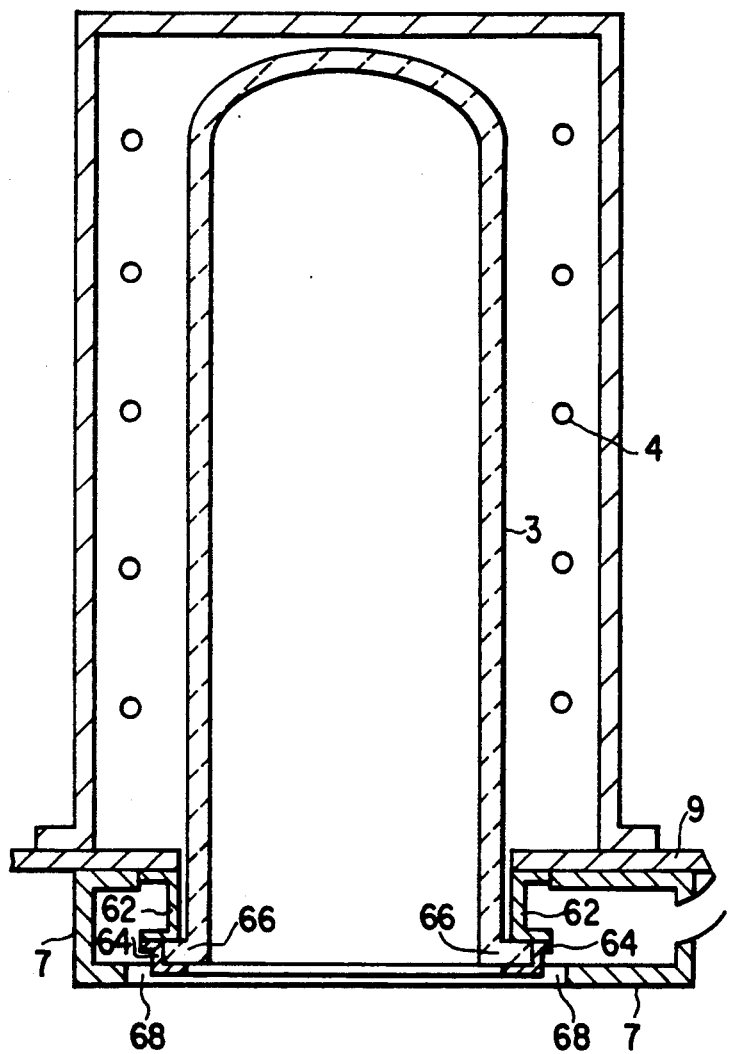
FIG. 6 is a view showing the process tube enlarged.

As shown in FIG. 6, the process tube 3 extends to the scavenger 7, passing through the base plate 6. A water-cooling section 62 extends along the circumferential rim of the through-hole of the scavenger 7, opposing its one side to the lower end portion of the process tube 3. This water-cooling section 62 of the scavenger 7 serves to prevent the lower end portion of the process tube 3 from being over-heated. The opposed side of the water-cooling section 62 has a clearance relative to the lower end portion of the process tube 3. The water-cooling section 62 is fixed to the base plate 6 by an appropriate means. A ring 64 is further located under the water-cooling section 62 to fix the process tube 3. The ring 64 is attached to the water-cooling section 62 by an appropriate means, fixing the process tube 3 in such a way that a bottom flange 66 of the process tube 3 is sandwiched between the water-cooling section 62 and the ring 64. A clearance 68 through which gases flow is formed between the outer circumference of the ring 64 and the circumferential bottom rim of the scavenger 7.

A duct 74 having a forcedly exhausting fan 72 is connected, at one end thereof, to an exhausting duct 9 of the scavenger 7 and, at the other end thereof, to an exhausted gas or air processing system 76 which includes a means for removing harmful components from the gas exhausted. An exhausted gas processing system 37 may be used to achieve the same function as that of the system 76, instead of using the latter.

A space 13 is formed under the scavenger 7. A wafer boat 10 mounted on a quartz-made heating sleeve 14 and housing therein a plurality of semiconductor wafers 12 to be processed at a certain pitch is held in the space 13, before loaded in and after unloaded out of the heat processing furnace 5.

The heating sleeve 14 is fixed to the top of a turntable 15 which is freely rotated by a drive means (not shown). A disk-like cap 16 is attached to the underside of the turntable 15 to air-tightly close the process tube 3. These heating sleeve 14, turntable 15 and cap 16 are formed as a unit attached to two arms 18 of an boat elevator 17, which is located on one side and in the lower portion of the heat processing apparatus 1. The boat elevator 17 has a guide shaft 19 extending in the vertical direction and rotated by a stepping motor (not shown). When the guide shaft 19 is rotated, the boat elevator 17 having a ball screw therein is moved up and down. The arms 18 are thus moved up and down together with the wafer boat 10.

A clean gas or air inlet 20 through which a clean gas is introduced into the space 13 is formed at the rear wall of the heat processing apparatus 1, right and under the boat elevator 17, when the apparatus is viewed from the front side thereof. A gas supply means 21 such as the blast fan which serves to forcedly feed the clean gas into the apparatus 1 is attached to the inlet 20. A damper (not shown) for adjusting the flow rate of the clean gas supplied is located adjacent to the blast fan 21.

A partition wall 22 made of steel, for example, and separated from the bottom of the apparatus 1 by a certain interval is arranged in the lower portion of the apparatus 1. A clean gas supply passage 23 is thus formed between the partition wall 22 and the bottom 21 of the apparatus 1 to supply the clean gas to the other side of the apparatus 1 through it. Particularly in the case of this example, it is preferable that the partition wall 22 extends to that side wall of the apparatus box where the boat elevator 17 is located. This is because the space 13 including a space in which the boat elevator 17 is housed is shut off from the clean gas supply passage 23 to prevent the clean gas, which has passed through the space 13 and the elevator-housed space, from entering into the clean gas supply passage 23. A fan unit 24, for example, is located at the lower left corner of the apparatus box 2 to blow up the clean gas supplied. A punched metal 29 is arranged above the fan unit 24, facing the space 13. A dust removing filter 25 such as the HEPA (high efficiency particulate air) filter is attached to the metal 29 to cause the clean gas to almost horizontally flow in the space 13. The width of the filter 25 is set substantially the same as that of the wafer boat 10. The punched metal 29 has its punched holes only at that area thereof to which the filter 25 is attached.

An elevator cover 30 made of stainless steel, for example, is located on the opposite side of the filter 25 to cover the boat elevator 17. This elevator cover 30 has two slits 32 extending in the vertical direction and the two arms 18 of the boat elevator 17 are passed through these slits of the elevator cover 30. A gas exhausting passage 31 extends above the elevator cover 30, passing through the cover 30, and the clean gas which has passed through the space 13 is collected and guided to a ceiling portion 8 of the box 2 by this gas exhausting passage 31.

Figure 4:
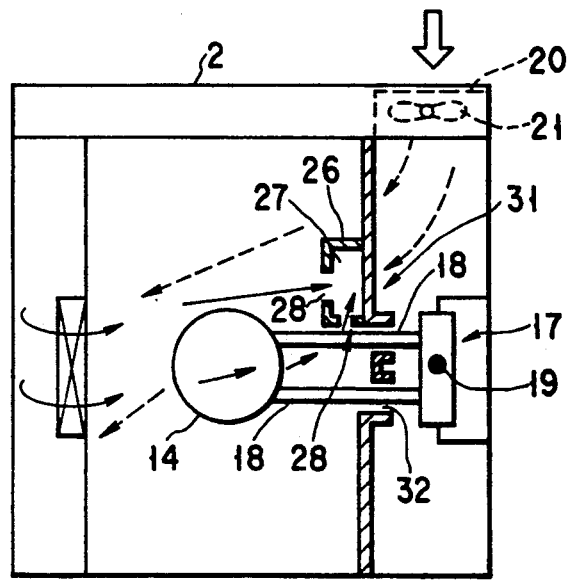
FIG. 4 is a cross-sectioned view along a line IV—IV in FIG. 3 viewed in the direction of its arrows.

More specifically, the gas exhausting passage 31 includes an exhausting path 27, which is formed by a U-shaped member 26 made of stainless steel and vertically attached to the elevator cover 30 along the center line and on that side thereof which faces the space 13, as shown in FIG. 4. The U-shaped member 26 has two slit-like inlets 28 extending in the vertical direction and the clean gas which has passed through the space 13 is taken into the exhausting path 27 through these inlets 28. After use, the clean gas can be thus prevented from entering into the boat elevator space. The boat elevator 17, therefore, cannot be eroded even if the clean gas exhausted includes erosive components in it. Further, top and bottom of the exhausting path 27 are closed by stainless steel not to allow the gas once taken into it to flow out to the space 13.

A first gas exhausting duct 39 is connected to the upper portion of the exhausting path 27, passing through the elevator cover 30, which cooperates with the U-shaped member 26 to define the exhausting path 27. The upper end of the exhausting duct 39 is connected to a gas collecting box 33 located above the boat elevator 17. Further, a gas exhausting duct 34 is connected to the box 33 and it extends to the ceiling 8 of the apparatus box 2. An exhausting outlet 35 is formed at the upper right portion of the rear wall of the apparatus box 2 and the clean gas which has passed through the space 13 is exhausted outside the box 2 through this exhausting outlet 35. The gas exhausting duct 34 is connected to the exhausting outlet 35. An exhausting fan 36 is located inside the exhausting outlet 35 and it serves as a means for promoting gas exhaustion to compensate for the loss of gas flow which is caused by the piping conductance of the gas exhausting duct 34. A flow rate adjusting damper (not shown) is arranged adjacent to the exhausting fan 36.

A duct 38 extends outside from the exhausting outlet 35 to the exhausted gas processing system 37 in which the means for removing harmful components from the gas exhausted is included. All of the gas exhausted can be therefore supplied to the exhausted gas processing system 37 without being exhausted into the maintenance room.

An opening 45 which is larger in size than the wafer boat 10 is formed at the lower front portion of the box 2, as shown in FIG. 2. It can be opened and hermetically closed by a slide door 46 driven by air. An arm 40 is arranged adjacent to the opening 45 to take the wafer boat 10 in and outside the apparatus.

Plural or four heat processing apparatuses 1 in FIG. 2, each having the above-described arrangement, are installed side by side. A carrier system 41 for carrying the wafer boats 10 in which wafers to be processed, or already processed are housed is arranged in front of the heat processing apparatuses 1. This carrier system 41 comprises a rail 42 extending along the heat processing apparatuses 1 and boat carriers 43 moving on the rail 42 with or without boat mounted on them.

Arranged at the front end of the rail 42, although not shown, are a carrier stock room for storing a plurality of wafer carriers in each of which 25 sheets of semiconductor wafers, for example, are housed, a wafer transfer system for transferring the semiconductor wafers from the wafer carrier to the wafer boat 10, and a boat transfer system for transferring the boat 10 from the wafer transfer system to the boat carrier while turning the boat 10 from horizontal to vertical.

A plurality of the semiconductor wafers are transferred from the wafer carrier in the wafer stock room (not shown) to the wafer boat, using the wafer and boat transfer systems (not shown). The wafer boat which has been erected is mounted on the boat carrier 43 of the boat carrier system 41 and moved in front of an intended heat processing apparatus 1. The slide door 46 which hermetically closes the opening 45 of the apparatus box 2 is opened and the wafer boat 10 on the boat carrier 43 is transferred to the arms 18 of the boat elevator 17. When the transferring of the wafer boat 10 to the arms 18 is finished, the slide door 46 is again closed and the apparatus 1 is thus kept hermetically closed.

Prior to this transferring of the wafer boat 10, the heat processing furnace is heated to a predetermined temperature according to the heat process conducted. At the same time, the blast fan 21, the fan unit 24 and the exhaust fan 36 in the apparatus 1 are driven. Therefore, clean gas (or air) taken in through the clean gas inlet 20 passes through the gas supply passage 23 on the bottom of the apparatus box 2 and after being blown upward by the fan unit 24, it almost horizontally flows into the space 13 through the dust removing filter 25. Its side flow is thus applied to the semiconductor wafers 12 in the space 13 to prevent dust from adhering to the wafers 12. The flow rate or speed of this side flowing gas is set in a range of 0.2–0.3 m/sec not to create any turbulence in the space 13 and not to stay the gas in the space 13. In other words, the gas supply fan 21, the exhaust fan 36 and their flow rate adjusting dampers are appropriately adjusted to create no turbulence in the space 13. The clean gas which has flowed through the space 13 while removing dust and others from the semiconductor wafers 12 flows into the exhaust path 27 through the slit inlets 28 of the gas exhausting passage 31 located opposite to the filter 29. The gas which has flowed into the exhaust path 27 is exhausted from the upper portion of the path 27 into the first gas exhaust duct 39 and then outside the box 2, passing through the gas collecting box 33, the second gas exhausting duct 34 and the exhaust outlet 35.

The duct 38 extends outside from the exhaust outlet 35 to the exhausted gas processing system 37. All of the gas which may contain dust removed from the semiconductor wafers, therefore, can be supplied to the exhausted gas processing system 37, common to the factory, without being exhausted into the maintenance room located adjacent to the apparatus 1. The duct 38 has the gas therein drawn by the exhausted gas processing system 37 so that the exhausting of the gas including the clean gas, the remaining harmful gas and so forth through the duct 38 is promoted.

When the heat processing furnace is heated to the predetermined temperature and the fans are driven to make the clean gas flow as described above, the semiconductor wafers 12 held in the space 13 are moved upward together with the wafer boat 10 and loaded in the heat processing furnace 5 by the boat elevator 17. The open bottom of the heat processing furnace 5 is then hermetically closed by the cap 16. And heat process is applied to the semiconductor wafers 12 in the furnace 5 for a predetermined time period, at a predetermined temperature and in an atmosphere of high corrosive process gas such as $POCl_3$.

$POCl_3$ reacts as follows to generate phosphorous pentoxide: $POCl_3 + \frac{5}{4}O_2 \rightarrow \frac{1}{2}P_2O_5 + 3/2Cl_2$ Even during this heat process, the clean gas is caused to flow at the above-mentioned flow rate and heat is exhausted from the heat processing furnace through the open bottom thereof while driving the scavenger 7. When this heat process is finished, gas in the heat processing furnace is discharged and this discharging of gas is repeated several times while filling the furnace with inactive gas such as nitrogen gas. Harmful gas remaining in the furnace 5 can be thus completely discharged.

The semiconductor wafers which have been heat-processed are then unloaded out of the heat processing furnace 5 and held in the space 13, while applying the side flow of the clean gas to them, until they are cooled to a temperature of about 200° C. Process and hot gases remaining in the heat processing furnace 5 are sucked and discharged from the furnace 5 through the open bottom thereof by the scavenger 7. The processed semiconductor wafers 12 release the process gas such as $POCl_2$ and $P_2O_5$ from their surfaces until they are cooled to about 200° C. However, a part of this process gas and heat remaining in the wafers 12 are also sucked and discharged outside the box 2 through the heat exhaust duct 9 by the scavenger 7. The duct 72 connected to the duct 9 has the gas therein sucked by the fan 74 to promote the discharging or exhausting of the gas through the duct 72. Harmful gas thus introduced by the duct 72 is processed by the harmful components removing means in the exhausted gas processing system 76.

Particles still remaining in the space 13 and the process gas which cannot be exhausted by the scavenger 7 are immediately exhausted into the gas exhaust passage 31 by the sideward flowing clean gas and then supplied directly into the exhausted gas processing system 37 through the exhaust outlet 35 and the duct 38. As the result, they are processed by the harmful components removing means in the system 37. As described above, the clean gas which has once passed through the space 13 is neither stayed nor re-circulated in the apparatus 1. It is not exhausted into the maintenance room either, but directly into the exhausted gas processing system 37. And it is processed by the system 37. The possibility that high corrosive phosphorous pentoxide and others adhere to metal parts in the apparatus 1 can be thus reduced to greater extent. The rusting of various means and units in the apparatus which is a cause for lowering the productivity of wafers can be prevented, accordingly. In addition, the cleanliness of atmosphere in the maintenance and clean rooms can be held so high as desired. The productivity of semiconductor wafers can be thus enhanced.

When the processed semiconductor wafers 12 are cooled lower than about 200° C., the slide door 46 is opened and the wafer boat 10 is transferred to the boat carrier 43 of the boat carrier system 41. And the above-described routine is reversely carried out. Then, another wafer boat 10 in which semiconductor wafers to be processed are housed is transferred to the boat carrier 43 of the boat carrier system 41 and carried to an intended heat processing apparatus 1. The above-described process is thereafter repeated.

According to the present invention, the clean gas is allowed to flow through the space 13 whether the heat process is being carried out or not. In addition, the clean gas which has passed through the space 13 is not exhausted into the maintenance room but supplied directly into the exhausted gas processing system 37. Therefore, the cleanliness of atmosphere in the maintenance and clean rooms can be held so high as desired and the probability that dusts such as particles adhere to the semiconductor wafers can be reduced to a greater extent. The productivity of the semiconductor wafers can be thus enhanced. In a experiment, the number of particles, larger in size than 0.2 $\mu$m, adhering to each of the 8-inch semiconductor wafers was reduced less than 5 in the above-described case.

Further, the process gas including harmful components and released from the processed semiconductor wafers in the space 13 is not exhausted into the maintenance room but processed by the exhausted gas processing system 37. The safety of the apparatus can be enhanced and operator's health cannot be damaged accordingly.

Still further, even if the gas released from the processed semiconductor wafers is corrosive, it can be immediately exhausted, as described above, outside the apparatus. The rusting of metal parts in the apparatus and various means related to the apparatus can be prevented. In addition, the rusting of them caused by adhering particles can also be prevented, thereby enhancing the productivity of semiconductor wafers.

In the embodiment described above, the semiconductor wafers are vertically stacked in the wafer boat at a certain interval and the wafer boat holding the wafers in this manner is transferred between the heat processing apparatus 1 and the boat carrier system 41. In other words, the so-called batch system has been described in the above case, but the present invention is not limited to this case. It can be applied to other apparatuses of the hermetically closed type, such as the apparatus of the type wherein plural wafer cassettes in each of which a plurality of semiconductor wafers can be housed are taken into the apparatus and the semiconductor wafers are automatically transferred between the wafer boat and the wafer cassette in the apparatus.

Figure 5:
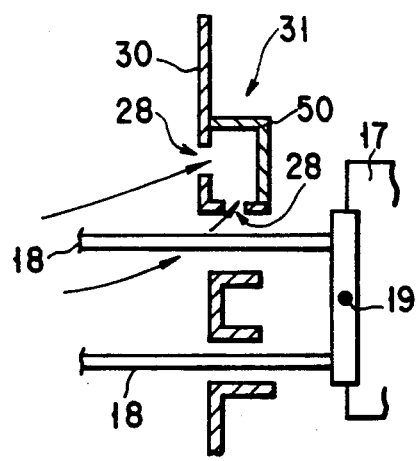
FIG. 5 is a view showing a variation of the clean gas exhausting passage employed by the heat processing apparatus of the vertical type.

Although the U-shaped member 26 has been attached to the outer side of the elevator cover 30 to form the gas exhausting passage 31 in the above case, an L-shaped member 50 may be attached to the inner side of the elevator cover 30, as shown in FIG. 5, to form the gas exhausting passage 31. The slit-like inlets 28 are formed in the elevator cover 30 in this case.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heat processing apparatus of the vertical type comprising:
   an apparatus box having at the lower end portion thereof an opening through which an object to be processed are carried in and out of the box;
   a door for opening and hermetically closing the opening of the box;
   a process tube having an open bottom and located in the upper half of the box;
   heaters enclosing the process tube;
   a space formed in the lower half of the box and under the process tube, and connected to the opening of the box;
   a cap for closing the open bottom of the process tube and supporting the object at the time of heat process;
   an elevator arranged in the box and serving to move the cap up and down between a position where the open bottom of the process tube is closed and another position in the space where the open bottom is opened;
   drive means for driving the elevator;
   supply means for supplying a clean gas into the space and provided with a first port by which the supply means is connected to the space;
   exhausting means for exhausting outside the box the clean gas which has passed through the space, and provided with a second port communicated with the space, said second port being located on that side of the cap which is opposed to the first port of the supply means; and
   collecting means for drawing and collecting the gas introduced by the exhausting means.

2. The apparatus according to claim 1, wherein said exhausting means has a member for forcedly exhausting the gas to promote gas exhaustion.

3. The apparatus according to claim 2, wherein said gas forcedly-exhausting member is a fan.

4. The apparatus according to claim 1, wherein said drive means is housed in the box and separated from the space by a partition.

5. The apparatus according to claim 1, wherein said exhausting means includes an exhaust duct for introducing the gas and said exhaust duct extends outside from the top of the box.

6. The apparatus according to claim 1, wherein said supply means has a member for forcedly supplying the gas to promote gas supply.

7. The apparatus according to claim 6, wherein said gas forcedly-supplying member is a fan.

8. The apparatus according to claim 1, wherein said supply means has a filter at the first port.

9. A heat processing apparatus of the vertical type comprising:
   an apparatus box having at the lower end portion thereof an opening through which an object to be processed are carried in and out of the box;
   a door for opening and hermetically closing the opening of the box;
   a process tube having an open bottom and located in the upper half of the box;
   heaters enclosing the process tube;
   a space formed in the lower half of the box and under the process tube, and connected to the opening of the box;
   a cap for closing the open bottom of the process tube and supporting the object at the time of heat process;
   an elevator arranged in the box and serving to move the cap up and down between a position where the open bottom of the process tube is closed and another position in the space where the open bottom is opened;

drive means for driving the elevator;

supply means for supplying a clean gas into the space and provided with a first port by which the supply means is connected to the space;

first exhausting means for exhausting outside the box the clean gas which has passed through the space, and provided with a second port communicated with the space, said second port being located on that side of the cap which is opposed to the first port of the supply means;

collecting means for drawing and collecting the gas introduced by the first exhausting means; and second exhausting means for exhausting a remaining gas in the process tube, and arranged adjacent to the open bottom of the process tube.

10. The apparatus according to claim 9, wherein said first exhausting means has a member for forcedly exhausting the gas to promote gas exhaustion.

11. The apparatus according to claim 9, wherein said drive means is housed in the box and separated from the space by a partition.

12. The apparatus according to claim 9, wherein said first exhausting means includes an exhaust duct for introducing the gas and said exhaust duct extends outside from the top of the box.

13. The apparatus according to claim 9, wherein said supply means has a member for forcedly supplying the gas to promote gas supply.

14. The apparatus according to claim 9, wherein said supply means has a filter at the first port.

15. The apparatus according to claim 9, wherein said second exhausting means includes a scavenger enclosing the lower end portion of the process tube.

16. The apparatus according to claim 15, wherein said scavenger has a cooling member opposed to the lower end portion of the process tube to prevent this portion of the process tube from being overheated.

17. The apparatus according to claim 16, wherein said cooling member is shaped like a ring and that face of said cooling member which is opposed to the lower end portion of the process tube has a clearance relative to this portion of the process tube.

18. The apparatus according to claim 9, wherein said second exhausting means has a member for forcedly exhausting the remaining gas to promote gas exhaust.

19. The apparatus according to claim 9, further comprising collecting means for collecting the gas introduced by the second exhaust means and removing harmful components from the gas thus collected.

* * * * *